United States Patent [19]

Berglund et al.

[11] 3,837,907

[45] Sept. 24, 1974

[54] MULTIPLE-LEVEL METALLIZATION FOR INTEGRATED CIRCUITS

[75] Inventors: Carl Neil Berglund, Warren Twp., Somerset County; Edward Haig Nicollian, Murray Hill; Michael Francis Tompsett, Summit, all of N.J.; Herbert Atkin Waggener, Allentown, Pa.

[73] Assignee: Bell Telephone Laboratories, Incorporated, Murray Hill, N.J.

[22] Filed: Mar. 22, 1972

[21] Appl. No.: 236,886

[52] U.S. Cl. .................... 117/212, 117/5.5, 117/8.5, 117/71 R, 117/217, 117/227, 156/8, 156/16, 156/17, 317/235 AZ, 317/235 G

[51] Int. Cl. ............................ B44d 1/18, H01l 5/02

[58] Field of Search ............ 117/212, 217, 227, 5.5, 117/8.5, 171 R; 317/235, 235 G, 235 AZ; 156/8, 16, 17

[56] References Cited

UNITED STATES PATENTS

| | | | |
|---|---|---|---|
| 3,585,469 | 6/1971 | Jager et al. | 317/235 |
| 3,651,349 | 3/1972 | Kahng et al. | 317/235 |
| 3,675,313 | 7/1972 | Driver et al. | 317/235 |
| 3,676,230 | 7/1972 | Rice | 317/235 |
| 3,678,573 | 7/1972 | Driver | 317/235 |
| 3,681,134 | 8/1972 | Nathanson et al. | 117/217 |
| 3,700,469 | 10/1972 | Okinaka | 117/130 E |
| 3,716,429 | 2/1973 | Napoli et al. | 156/17 |

FOREIGN PATENTS OR APPLICATIONS

| | | | |
|---|---|---|---|
| 2,020,355 | 11/1970 | Germany | 317/235 |

*Primary Examiner*—Douglas J. Drummond
*Assistant Examiner*—Basil J. Lewris
*Attorney, Agent, or Firm*—G. W. Houseweart; P. V. D. Wilde

[57] ABSTRACT

A method of forming multi-level metallization in integrated circuits with essentially zero effective lateral spacing between adjacent isolated metal portions. Indentations are formed at least partially through a first dielectric layer; and a second dielectric layer having apertures registered with and smaller than the indentations is formed thereover such that portions of the second layer overhang the indentations at the perimeters thereof. A thin metal layer then is deposited over the surface of the structure. Because the second dielectric layer overhangs the indentations, the deposited metal is discontinuous at the perimeter of each of the indentations if the deposited metal layer is kept sufficiently thin. Selective connection of adjacent metal portions at any portion of the perimeter of any indentation is made by any of a variety of techniques, such as electroless plating of gold through a photoresist mask.

1 Claim, 10 Drawing Figures

MULTIPLE-LEVEL METALLIZATION FOR INTEGRATED CIRCUITS

BACKGROUND OF THE INVENTION

This invention relates generally to the fabrication of semiconductor devices; and, more particularly, to a method for forming multiple-level metallization over semiconductor devices such that adjacent metal portions can have essentially zero effective lateral spacing while remaining electrically isolated.

A variety of motivations, including size, cost, and high-speed performance, have led the integrated circuit designer towards ever smaller geometries and, in particular, towards ever more closely spaced metallization patterns for electrodes and interconnections. In addition, in some solid state devices, such as certain charge transfer device types, closely spaced electrodes and multiple-level electrodes are important to efficient operation, as well as to the above-mentioned factors.

SUMMARY OF THE INVENTION

To these and other ends, a primary object of this invention is a method for fabricating multiple-level metallizations for solid state devices in such a manner that laterally adjacent metallization portions may be formed with essentially zero effective lateral spacing therebetween while nevertheless remaining electrically isolated one from another.

In accordance with the method of this invention, indentations are formed at least partially through a first dielectric layer which is disposed over the surface of a solid state substrate; and a second and different dielectric layer having apertures registered with and smaller than the indentations is formed over the surface of the first dielectric layer such that portions of the second layer overhang the indentations at the perimeters thereof. In a first-described embodiment, a thin conductive layer then is deposited on the surface of the structure to a thickness less than the combined depth of an indentation and the aperture thereover. Because of this thickness relationship and because portions of the second layer overhang the indentations at the perimeters thereof, the deposited conductive material is discontinuous at the perimeters of the apertures in the second layer, i.e., portions of the conductive material in the indentations are not physically or electrically connected with portions of the conductive material over the second layer, and, as will be appreciated more fully from the detailed description hereinbelow, there is essentially zero effective lateral spacing between the outer perimeter of any conductive portion in an indentation and the laterally adjacent portion of the conductive material overlying the second layer near the inner perimeter of the overlying aperture.

Selective electrical and physical connection of adjacent isolated portions can be made in a variety of ways, including selective electroplating and/or electroless plating of conductive material through a photoresist mask.

More specifically, in accordance with a first-described embodiment of our invention, there is formed a first dielectric layer over the surface of a solid state substrate. A second layer of a second and different material is formed over the surface of the first layer. An apertured mask is formed over the second layer; and the structure is immersed in an ambient which etches the second material but which advantageously does not appreciably attack the dielectric of the first layer. In this manner, there is formed an aperture through the second layer under the aperture in the mask. The mask is then removed; and the structure is immersed in an ambient which etches the dielectric of the first layer but which does not appreciably attack the dielectric of the second material. In this manner, there is formed either a void or an indentation in the first layer under the aperture in the second layer, with the void being undercut with respect to the aperture in the second layer such that portions of the second layer adjacent the perimeter of the apertures therein overhang the perimeter of the void or indentation in the first layer.

Conductive material, e.g., metal, then is evaporated over the surface of the structure for a time sufficient to form conductive portions of thickness less than the depth of the deepest indentation plus the depth of the aperture in the second layer. Because the deposited conductive material is of the described thickness and because the second layer overhangs the indentations, the deposited conductive material is physically and electrically discontinuous at the perimeter of each aperture in the second layer and there is essentially zero effective lateral distance between the outer perimeter of any portion of conductive material in an indentation and the portion of the conductive material overlying the second layer adjacent the inner perimeter of the overlying aperture. Selective electrical and physical connection between adjacent isolated portions of conductive material can be made by depositing, for example, by electroplating or electroless plating of conductive material, e.g., gold, through a suitable mask, such as photoresist.

Alternatively, such selective connection can be formed during the first deposition of the thin conductive material by removing the overhang from a portion of the perimeter of any indentation prior to deposition.

Still another alternative for forming selective connection between adjacent isolated portions is to deposit the conductive material to a thickness greater than the combined depth of the indentations and apertures such that bridging of conductive material over the overhangs automatically takes place, i.e., such that the conductive material is not discontinuous at the perimeters of the apertures. Then the thick deposited conductive material is at least partially removed from all portions of the structure, except those portions in which it is desired to form a bridge between the indentations and the top of the second layer. A subsequent deposition of material thinner than the combined depth of the indentations and apertures provides conductive material in the indentations and over the remaining portions of the second layer, with discontinuities at the perimeters at all points except where the previously deposited thick, conductive material has been defined.

Inasmuch as the method of this invention is a convenient one for forming close-spaced, multi-level electrodes which are important to efficient operation of many charge transfer devices, the detailed description of the invention immediately herebelow will be primarily in terms of such devices, although the more general applicability should be evident.

BRIEF DESCRIPTION OF THE DRAWING

The foregoing and other objects, features, and advantages of the invention and the invention in general will be more clearly understood from the following detailed description taken in conjunction with the drawing, in which:

FIGS. 1, 2, and 6–8 show in cross-section a portion of solid state apparatus substantially as it appears following successive fabrication steps in accordance with another embodiment of this invention; and FIGS. 1, 9, and 10 show in cross-section a portion of semiconductor apparatus substantially as it appears following successive fabrication steps in accordance with still another embodiment of this invention.

Figure 1:
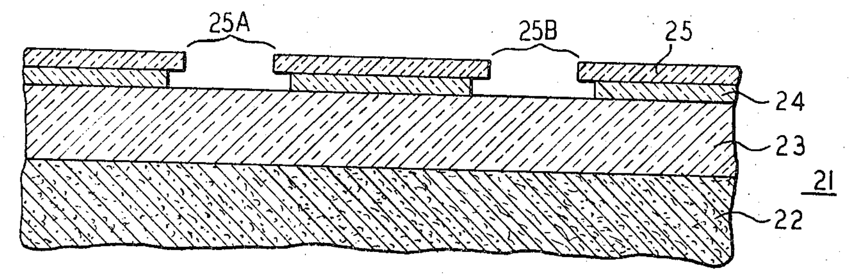
FIGS. 1–5 show in cross-section a portion of solid state apparatus substantially as it appears following successive fabrication steps in accordance with a first embodiment of this invention.

It will be understood that for simplicity and clarity of explanation the figures of the drawing have not necessarily been drawn to scale.

DETAILED DESCRIPTION

With more specific reference now to the drawing, FIG. 1 shows in cross section a portion of a structure substantially as it appears following initial preparatory but significant steps in accordance with a first embodiment of this invention. As shown, portion 21 includes a bulk portion 22 which may be virtually any solid material but which, for the purpose of this invention, typically will be semiconductive, usually silicon. Over bulk portion 22 there has been formed an insulating layer 23 advantageously of sufficiently high quality for use under the gate electrode of an insulated gate field-effect transistor (IGFET). As will be appreciated, layer 23 may be formed by thermal oxidation of the bulk portion 22 or by any of a variety of deposition techniques known to the art, such as, for example, chemical vapor deposition.

Over layer 23 there was formed a second layer 24 of an insulating material different from the material of layer 23, different in the sense that selective etching will be enabled in the manner described below. Then, for practical reasons, which will be explained hereinbelow, there was formed over layer 24 a third dielectric layer 25 which advantageously may be of the same material used in layer 23. However, layer 25 may be a dissimilar material, the only important criterion being that it be sufficiently adherent to layer 24 in solutions which etch layer 24 to enable selective etching of portions of layer 24. As an example, the thickness of layer 23 may be about 3,500 Angstroms of silicon oxide; layer 24 may be about 1,000 Angstroms of aluminum oxide or silicon nitride, and layer 25 may be about 2,000 Angstroms of silicon oxide.

After forming layers 23, 24, and 25, there was formed over layer 25 in known fashion a photoresist mask (not shown) and the structure was then subjected to an ambient, e.g., hydrofluoric acid where layer 25 is silicon oxide, which etched exposed portions of layer 25 to form voids 25A and 25B therethrough. Then the photoresist mask was removed and the structure was immersed in another ambient, e.g., hot phosphoric acid at about 170°C., which etched through layer 2, e.g., aluminum oxide, to form the illustrated voids therethrough under voids 25A and 25B.

As an example, voids 25A and 25B may be typically about 10 microns in linear dimension and may be separated by 10 micron wide portions of layer 24.

Next, layer 25 is removed from the structure of FIG. 1, for example, by etching in a solution which dissolves layer 25 but does not appreciably attack the material of layer 24. The resulting structure is then immersed in an ambient, e.g., hydrofluoric acid, which etches the material of layer 23 but does not appreciably attack the material of layer 24. In this manner, the portions of layer 23 exposed through the voids in layer 24 are etched either partially through to the surface of bulk portion 22, for example, leaving a thickness of about 1,000–1,500 Angstroms, or entirely through, as desired. In the latter case, a thin, fresh layer of insulating material may be formed, for example, to a thickness of about 1,000–1,500 Angstroms, in all or selected ones of the etched portions of layer 23, depending upon whether direct electrical connection is desired to the surface of bulk portion 22.

Figure 2:
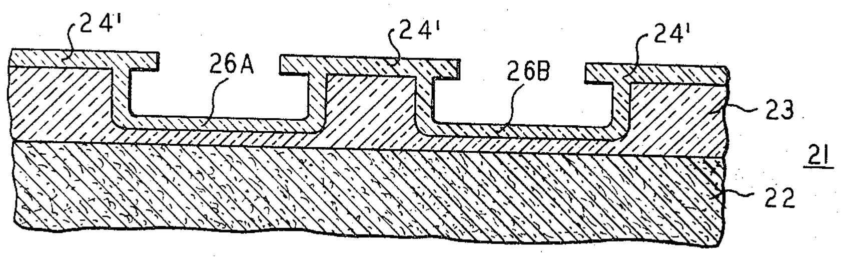

The structure shown in FIG. 2 depicts portion 21 after the etching (and re-formation, if needed) of layer 23 and after an additional step involving the deposition either of more of the material of layer 24 or of a distinct insulating material has taken place. Because of this deposition, the reference numeral for layer 24 has been changed to 24′ in FIG. 2. This deposition of additional insulating material, for example, about 500 Angstroms of aluminum oxide or silicon nitride, depicted principally by features 26A and 26B, is entirely optional. The deposition is included in the embodiment being described since it is one in which the indentation regions 26A and 26B will be used for an electrical function like the gate of an IGFET where high-quality passive dielectric material is important and where in the prior art it is common to use a dual dielectric typically including a thin layer of silicon oxide covered by a thin layer of aluminum oxide or silicon nitride.

Figure 3:
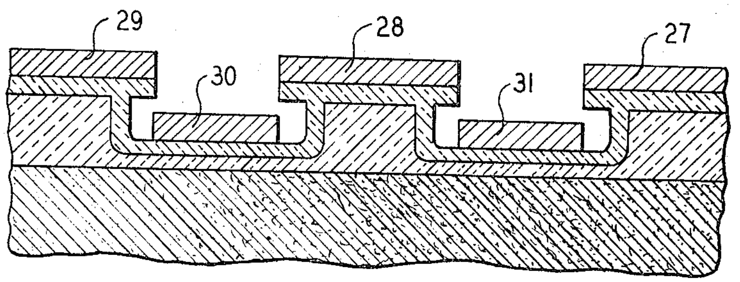

An important feature to be noted in FIG. 2 is that, due to undercutting during the etching of one dielectric using another as a mask, portions of layer 24′ surrounding the entire perimeters of indentations of 26A and 26B overhang those indentations. This is important to this invention because, as shown in FIG. 3, a subsequent deposition of conductive material, for example, by evaporation, to a thickness less than the height of the indentations produces localized portions 27–29 of conductive material over layer 24′ and localized portions 30 and 31 of conductive material in the indentations, the latter being physically and electrically separated from portions 27–29. This physical and electrical separation, i.e., isolation, results because the deposited conductive material is unable to bridge the overhang portions.

As illustrated in FIG. 3, the result is a structure having conductive portions 27–29 separated by a relatively large distance from the surface of layer 22 and another plurality of conductive portions 30 and 31 spaced a relatively short distance from the surface of bulk portion 22. It should be noted further that the outer edge of each of portions 30 and 31 is aligned substantially with the inner portions of the apertures thereover such that there is essentially zero effective lateral spacing between, for example, portions 27 and 31, portions 28 and 31, etc.

The term "zero effective" lateral spacing is used to suggest the fact that the lower electrodes, e.g., 30, may extend under the upper electrodes, e.g., 28 and/or 29, instead of being perfectly aligned. In either case the "effect" on the electrical characteristics is the same. The term "essentially zero" is used to account for the fact that the outer perimeter of the lower electrodes may not be perfectly aligned with the inner perimeter of the overlying apertures, as will be appreciated by those in the art, due to scattering of evaporated atoms and possible oblique angles of evaporation, for example. In such cases the term "essentially zero" will be understood to mean less than a few thousand Angstroms.

Having achieved this structure of FIG. 3, which will be appreciated to be of utility in and of itself for certain applications, a final objective often is to provide selective electrical connection between adjacent ones of the conductive portions, for example, between conductor 28 and conductor 30, and between conductor 27 and conductor 31. As will be demonstrated in successive embodiments to be described below, there are a plurality of ways for achieving such selective electrical connection. A method which is presently considered convenient will be described first.

Figure 4:
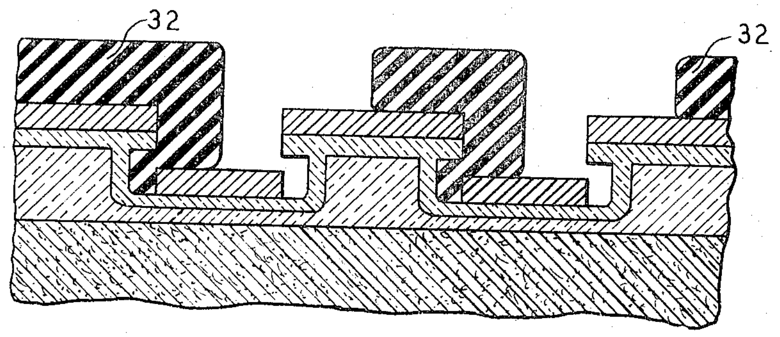
Figure 5:
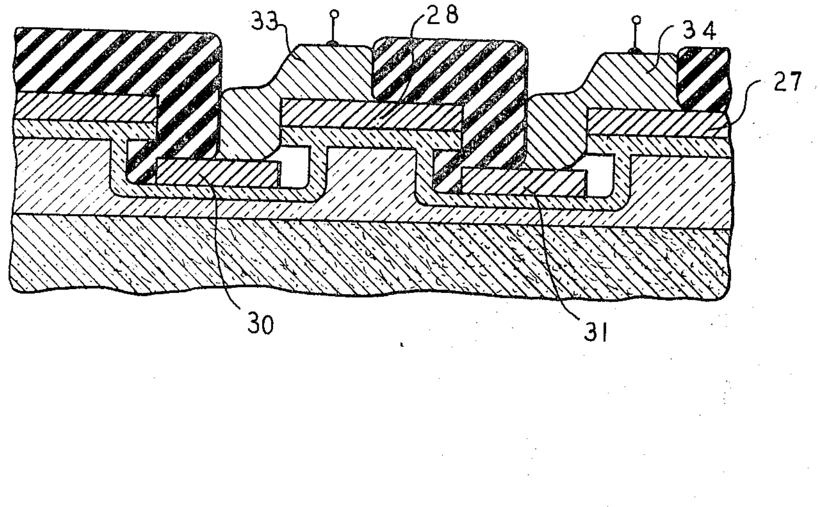

As shown in FIG. 4, there is first formed over the structure of FIG. 3 a mask 32, for example, a photoresist mask, leaving exposed where connection is desired the portions of the perimeters of the adjacent portions to which contact is to be made. Then, using techniques known to the art, conductive material is deposited selectively through the apertures of mask 32 to a thickness sufficient to bridge the gap between adjacent conductive portions. The result, depicted in FIG. 5, shows deposited conductive portions 33 and 34 bridging respectively the gap between conductive portions 28 and 30 and the gap between conductive portions 27 and 31.

The exact technique by which this latter deposition is accomplished is not considered critical to this invention. However, plating, especially electroless plating, of gold is considered a convenient technique and will be briefly described.

In certain embodiments which have been fabricated in accordance with this invention, conductive portions 27–31 have each been a composite of titanium and palladium, the titanium being about 500 Angstroms thick and contiguous with the surface of dielectric 24′, 26A, and 26B and the palladium being about 1,000 Angstroms thick and disposed over the titanium. With this structure, bridging contacts 33 and 34 have been formed by electroless plating of gold to a thickness of about one micron (10,000 Angstroms). The thickness criterion for the gold, of course, is simply that it be as thick or thicker than the combined height of metallic portions 27–29 plus the depth of the indentations 26A and 26B, i.e., sufficiently thick that bridging is achieved.

The selective electroless plating is accomplished by immersing a masked structure, such as FIG. 4, into a solution known to provide electroless plating onto the exposed metals. A presently preferred solution is a borohydride bath of the following composition: 0.003 M $KAu(CN)_2$, 0.1 M KCN, 0.2 M KOH, and 0.2 M $KBH_4$, such as taught by Y. Okinaka in *Plating*, Vol. 57, page 914 (1970), and in U.S. patent applications Ser. No. 872,610, filed Oct. 30, 1969, now abandoned, and Ser. No. 122,103, filed Mar. 8, 1971, now U.S. Pat. No. 3,700,349. As is suggested therein, and as is known to the art, agitation of the bath to prevent depletion of gold ions near the plating sample is advantageous.

After the plating is completed, mask 32 is removed by dissolution in a known solution. For example, if mask 32 is KMER photoresist supplied by the Eastman Kodak Company and commonly used in the art, then a dissolving solution supplied by Kodak for that purpose is preferred.

Considering now the structure of FIG. 5, it will be appreciated that conductive portions 27, 31, and 34 are physically and electrically common and so may be considered a single electrode which is nonuniformly spaced from the surface of the substrate; and likewise conductive portions 28, 30, and 33 may be considered a single electrode. Further, as seen in FIG. 5, there is essentially zero lateral spacing between the two electrodes. As taught in U.S. patent application Ser. No. 11,448, filed Feb. 16, 1970, now U.S. Pat. No. 3,651,349, in the names of D. Kahng and E. H. Nicollian, such a structure is advantageously suited for two-phase charge coupled device operation.

Referring back now to the three dielectric layers described with respect to FIG. 1, it should be understood that only two of those layers are essential to the process described. However, in the above-described embodiment using silicon oxide as the first layer 23 and aluminum oxide or silicon nitride as the second layer 24, the third layer 25, which advantageously is silicon oxide, is employed because known photoresist masks are not completely satisfactory in the hot phosphoric acid solutions commonly used to etch aluminum oxide and silicon nitride. Hence a more satisfactory mask 25 of silicon oxide is first formed using a photoresist mask as described above.

As mentioned above, there are alternative methods for forming selective connection between adjacent conductive portions, when this is desired, in accordance with this invention. One such alternative will now be describe with respect to FIGS. 1, 2, and 6–8 which show in cross-section a portion of a solid state structure substantially as it appears following certain successive fabrication steps in accordance with another embodiment of this invention. Inasmuch as the formation of FIG. 2 has been described in detail, only the successive steps illustrated by FIGS. 6–8 need be described.

Figure 6:
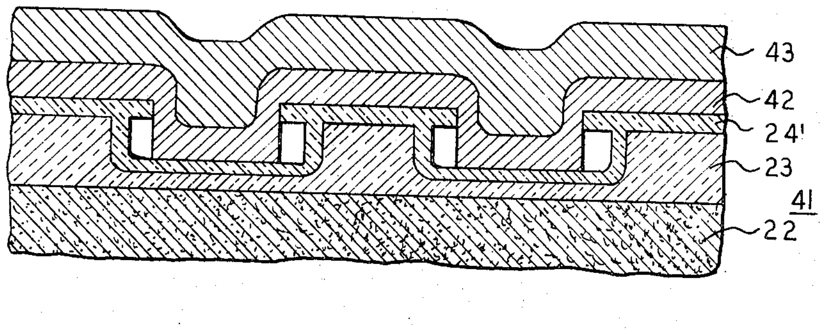

As shown in FIG. 6, there is formed over the structure of FIG. 2 a relatively thin conductive layer 42 which nevertheless is thicker than the combined depth of the thickness of layer 24′ and the indentations in layer 23. In this manner, layer 42, which, for example, may be a combined layer of 1,000 Angstroms of titanium and 2,000 Angstroms of palladium, bridges the overhang regions such that the layer is continuous. Over layer 42 a relatively thick layer 43 of conductive material, such as gold, is formed to provide sufficiently low resistance in the electrodes. As such, of course, layer 43 may be omitted entirely, if desired.

Figure 7:
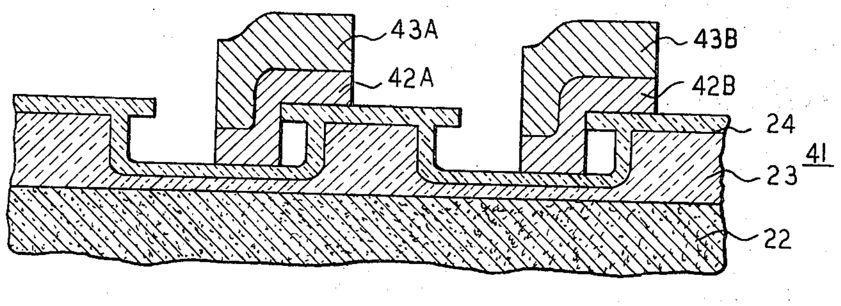

Then, as shown in FIG. 7, most of the combined layers 42 and 43 are removed in a photoresist masking and etching operation, leaving only selected portions 42A, 43A, 42B, and 43B for providing selective physical and electrical connection between adjacent plateaus and indentations, as desired.

Figure 8:
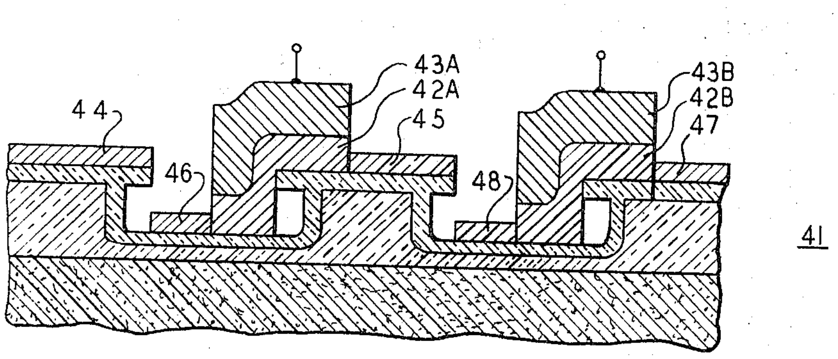
Figure 9:
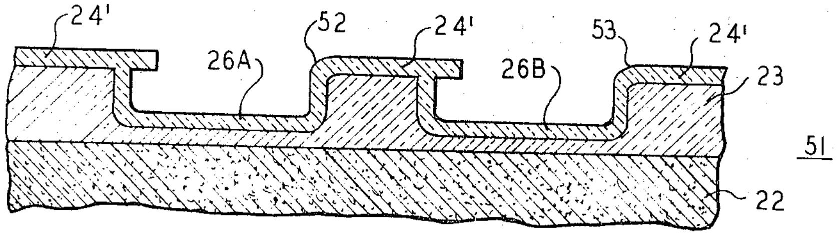
Figure 10:
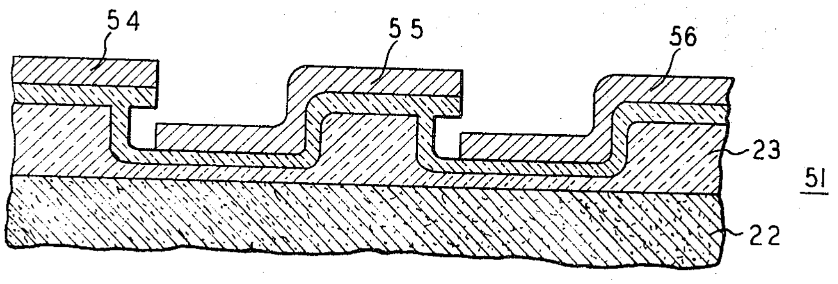

Finally, as illustrated in FIG. 8, a thin conductive layer is deposited nonselectively over the entire surface of FIG. 7. This final deposition is sufficiently thin that bridging at the overhang regions is not achieved. As a result, there are formed conductive portions 45 and 46 contiguous with and electrically common with previously formed conductive portion 42A, conductive portions 47 and 48 contiguous with and electrically common with previously formed conductive portion 42B, and thin conductive portion 44 which is contiguous with another thick conductive portion not shown in the drawing. Of course, this nonselective deposition also forms additional conductive portions over gold portions 43A and 43B, but such are not sufficiently thick to alter the properties thereof and so, for simplicity, are not indicated in the drawing.

Alternatively, the structure of FIG. 6 can be masked and etched such that only portions of layer 43 are removed, leaving portions 43A and 43B overlying layer 42, which remains substantially undisturbed. Since the portions of layer 42 which bridge the overhangs are thinner than other portions of the layer, controlled thinning of layer 42, using portions 43A and 43B as a mask, can be used for establishing the discontinuities at the overhangs and thus, to produce a structure like FIG. 8. In this manner, the final deposition step to produce portions 44–48 is obviated. It should be noted, however, that titanium-palladium is not presently preferred if controlled thinning is to be used, as the etch rate thereof is not presently as controllable as desired. Other materials, e.g., aluminum or tungsten, having a more controlled etch rate are preferred for layer 42 for such use.

At this point, a comparison of the structures of FIGS. 5 and 8 indicates that, while superficially somewhat different, they are functionally the same.

Still another alternative method for forming selective connection between adjacent conductive portions is illustrated by the sequence of FIGS. 1, 2, 9, and 10. Again, since FIGS. 1 and 2 have been described, their description will not be repeated.

Beginning with the structure of FIG. 2, a masking operation is performed to selectively remove only certain portions of layer 24′ which overhangs indentations 26A and 26B. The result shown in FIG. 9, for example, is that portions of layer 24′ overhang indentations 26A and 26B at the left but not at the right thereof. At the right side of the indentations the overhang has been removed and the corner made somewhat rounded, as indicated by reference numerals 52 and 53. With this structure, a thin deposition of conductive material to a thickness less than the combined depth of the second layer and the indentations produces the structure of FIG. 10. As shown, the deposited material is discontinuous at the overhangs and yet continuous at the rounded portions 52 and 53, the result being electrodes 54–56 which are nonuniformly spaced from the surface of substrate 22 and which have essentially zero lateral spacing therebetween. Electrodes 54–56 may be plated up to greater thickness, if desired, using photoresist masking techniques for protecting the separation zones during the plating process, as will be apparent to those in the art.

Although usually not critical to the practice of this invention, it is often advantageous to perform a slight etch of the finished structure (FIGS. 5, 8, and/or 10) to remove any spurious bridging, e.g., between portions 44 and 46 of FIG. 8 which may have been caused, for example, by particulate contamination present during deposition of the thin metal. Of course, this etch should not be of duration long enough to unduly thin portions such as 44 and 46 which are to be retained.

Although the invention has been described in detail with reference to two-phase charge coupled device structures, it will be apparent that the method can be used in general for forming multiple-level metallizations in integrated circuits where zero effective lateral spacing between adjacent metal portions is desired.

Various modifications and variations will no doubt occur to those skilled in the arts to which this invention pertains. All such variations which basically rely on the teachings through which this description has advanced the art are properly considered within the scope of this invention.

What we claim is:

1. A method of forming a charge transfer device having multiple-level electrodes comprising the steps of:

providing a structure including a silicon storage medium, a thermally grown silicon dioxide layer less than 3,500 Angstroms disposed over the storage medium, and a dielectric layer wherein the dielectric is a material selected from the group consisting of silicon nitride and aluminum oxide disposed over the silicon dioxide layer;

etching with hot phosphoric acid to form a plurality of apertures through the dielectric layer, thus forming a mask with which to selectively etch portions of the silicon dioxide layer;

selectively etching with hydrofluoric acid portions of the silicon dioxide layer exposed through the apertures in the dielectric layer to form indentations at least partially through the silicon dioxide layer and registered with and larger than the apertures in the dielectric layer such that portions of the dielectric layer at the perimeter of each aperture therein overhang a portion of the indentations formed in the silicon dioxide layer;

removing a portion, but less than all, of each overhanging perimeter and rounding off that portion of the perimeter from which the overhang was removed; and depositing on the apertured surface and on the surface of the indentations a conductive material of thickness less than the combined thickness of the second layer and the depth of an indentation such that the deposited material is discontinuous at the overhanging perimeter and yet continuous at the rounded portions thereby forming electrode portions which are nonuniformly spaced from the silicon storage medium and which have essentially zero lateral spacing therebetween.

* * * * *